United States Patent
Kutilek et al.

(10) Patent No.: US 8,541,055 B2
(45) Date of Patent: Sep. 24, 2013

(54) REFLECTIVE COATINGS FOR GLASS ARTICLES, METHODS OF DEPOSITION, AND ARTICLES MADE THEREBY

(75) Inventors: Luke A. Kutilek, Oakmont, PA (US); Mehran Arbab, Pittsburgh, PA (US); Songwei Lu, Wexford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 614 days.

(21) Appl. No.: 12/649,745

(22) Filed: Dec. 30, 2009

(65) Prior Publication Data

US 2011/0155685 A1     Jun. 30, 2011

(51) Int. Cl.
*C23C 16/06* (2006.01)
*C23C 16/44* (2006.01)

(52) U.S. Cl.
USPC ................. 427/255.36; 427/453; 427/255.31; 427/248.1

(58) Field of Classification Search
None
See application file for complete search history.

(56) References Cited

U.S. PATENT DOCUMENTS

| | | | |
|---|---|---|---|
| 2,375,482 A | 5/1945 | Lyle | |
| 3,323,889 A | 6/1967 | Carl et al. | |
| 3,516,811 A | 6/1970 | Gatchet et al. | |
| 3,690,289 A * | 9/1972 | Frank | 118/720 |
| 3,819,404 A | 6/1974 | Scholes et al. | |
| 3,934,063 A * | 1/1976 | Dubble | 427/223 |
| 4,230,068 A * | 10/1980 | Itoh et al. | 118/634 |
| 4,389,234 A | 6/1983 | Lindner | |
| 4,431,692 A | 2/1984 | Hofmann et al. | |
| 4,457,957 A | 7/1984 | Novak et al. | |
| 4,668,268 A | 5/1987 | Lindner et al. | |

* cited by examiner

*Primary Examiner* — Joseph Miller, Jr.
(74) *Attorney, Agent, or Firm* — Andrew C Siminerio

(57) ABSTRACT

The present invention is directed toward a method for coating an article by placing the article in a coating apparatus comprising at least one coating chamber having at least one air conduit in flow communication with the coating chamber via an air pathway. A portion of the article extends into a shielding member. At least one coating member is positioned in the coating chamber and is in flow communication with a source of titanium-containing coating material. The coating member deposits the coating material onto the exterior of the article to form a coating. At least one exhaust member is in flow communication with the coating chamber via an exhaust pathway for removing excess coating material from the coating chamber.

3 Claims, 1 Drawing Sheet

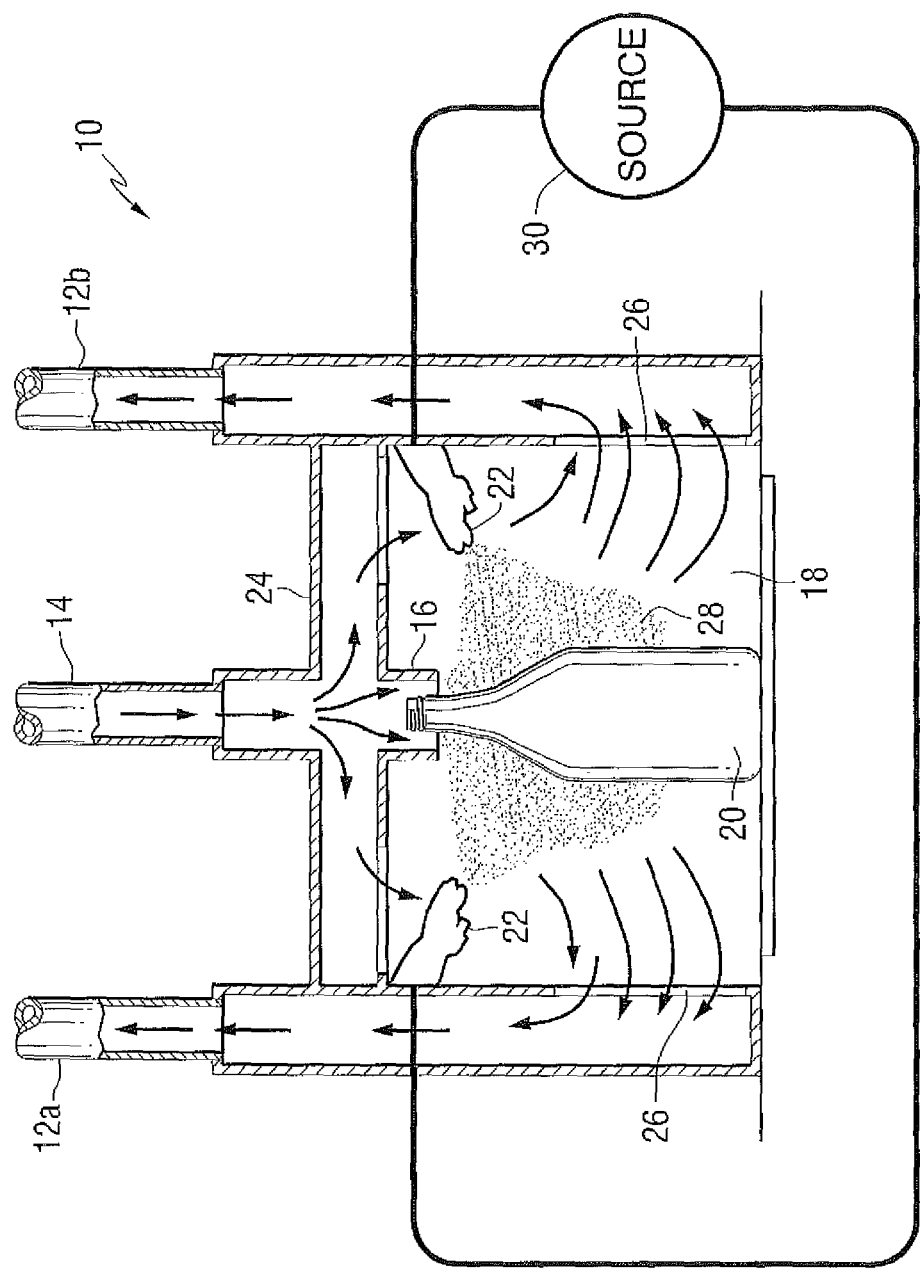

REFLECTIVE COATINGS FOR GLASS ARTICLES, METHODS OF DEPOSITION, AND ARTICLES MADE THEREBY

BACKGROUND OF THE INVENTION

1. Field of the Invention

The present invention relates generally to glass articles and, more particularly, to glass articles having reflective coatings that enhance the articles for product differentiation, UV protection, heat absorption protection and ease of refrigeration. The present invention is also directed to methods of and apparatus for forming reflective coatings on glass articles.

2. Description of the Prior Art

The practice of coating glass articles is well known in the art. It has been common practice in the production of glassware to deposit "hot end" coatings upon the newly formed glass, usually at or before the annealing lehr while the glassware is at an elevated temperature. These "hot end" coatings are typically deposited by chemical vapor deposition (CVD), which involves directing a stream of vapors laden with metal-containing species toward the hot glass container surface to produce a thin layer of metal oxide, typically stannic or titanic oxide. After formation of the "hot end" coating, it is conventional practice to thereafter apply a lubricious "cold end" coating at lower temperatures. The "hot end" coating serves to anchor the subsequently applied "cold end" coating, usually a waxy lubricant added after annealing. Without the metal-oxide layer, such waxy lubricants do not adhere well to glass. The purpose of both "hot end" and "cold end" coatings is to provide protection against scratching and the ensuing loss of strength. And, as such, with those coatings it is preferred that they should not change the appearance of the glassware.

For example, many beer bottles are brown or a similar dark color. The only differentiation between products comes from the different labels or other indicia applied to the bottle. For certain marketing applications, it may be desirable to further differentiate one product from another to provide immediate product recognition in a crowded product environment. The present invention is directed to a method of providing such product differentiation.

SUMMARY OF THE INVENTION

A coating apparatus of the invention comprises at least one coating chamber having at least one makeup air conduit in flow communication with the coating chambers via a makeup air pathway connecting the makeup air conduit to the coating chamber. At least one coating member is positioned in the coating chamber. The coating member is in flow communication with a source of coating material including a titanium containing coating material. At least one exhaust member is in flow communication with the coating chamber via an exhaust pathway for removing excess coating and air from the coating chamber.

A method of coating an article comprises placing an article to be coated into a coating apparatus, depositing a titanium-containing coating onto the article within the coating apparatus; transferring air into the coating apparatus; and removing excess coating and air from the coating apparatus.

A beverage container comprises a glass container having an interior chamber and an outer surface. A titania coating is formed over at least a portion of the outer surface and has a thickness in the range of 200 Å to 800 Å and a luminous reflectance in the range of 12% to 38%.

BRIEF DESCRIPTION OF THE DRAWING

FIG. 1 is a cross-sectional view of the coating apparatus of the invention.

BRIEF DESCRIPTION OF THE INVENTION

As used herein, spatial or directional terms, such as "left", "right", "inner", "outer", "above", "below", "top", "bottom", and the like, relate to the invention as it is shown in the drawing FIGURE. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to include the beginning and ending range values and to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. Further, as used herein, the terms "deposited over", "applied over", or "formed over" mean deposited or formed on, but not necessarily in contact with the surface. For example, a coating composition "deposited over" a substrate does not preclude the presence of one or more other coating films of the same or different composition located between the deposited coating and the substrate. The term "film" refers to a region of a coating having a desired or selected composition. A "layer" comprises one or more "films". A "coating" or "coating stack" is comprised of one or more "layers". Any document referred to herein should be considered to be "incorporated by reference" in its entirety.

Referring to FIG. 1, there is shown a coating apparatus 10 comprising at least one coating chamber 18. At least one makeup air conduit 14 is in flow communication with the coating chamber 18 via a makeup air pathway 24 connecting the makeup air conduit 14 to the coating chamber 18. At least one coating member 22 is positioned within the coating chamber 18. The coating member 22 is in flow communication with a source of a titania coating material 30. At least one exhaust member 12 is in flow communication with the coating chamber 18 via an exhaust pathway 26 for removing excess coating 28 and air from the coating chamber 18.

The at least one coating chamber 18 may be at least partially enclosed to permit concentrations of coating material to be contained therein without undue disturbance from the surrounding environment. The coating chamber 18 may be comprised of any conventional materials, such as metal or plastic, and can be of any desired dimension. Additionally, the coating chamber 18 may be provided with openings at opposite ends to permit passage of articles to be coated, for example, on an assembly line.

The makeup air conduit 14 may comprise any air handling conduit suitable to condition and/or circulate makeup air into the coating chamber 18. The makeup air conduit 14 can be comprised of any conventional materials, such as metal or plastic, and can be of any desired dimension. The makeup air conduit 14 may be designed to receive makeup air from a makeup air source and pump the makeup air into the coating apparatus 10. The makeup air source may be outside air, recirculated air, or a combination of outside air and recirculated air. The makeup air conduit 14 may include a blower member, temperature control elements, filtering units, humidifiers, mixing chambers, and/or dampers, as are known in the art.

The makeup air conduit 14 transmits the makeup air into the coating chamber 18 via a makeup air pathway 24. The makeup air pathway 24 can be comprised of any conventional material such as metal, plastic, or a combination thereof and may be of any desired dimension. The makeup air pathway 24 connects the makeup air conduit 14 to the coating chamber 18 and may be any suitable air flow pathway known to one of ordinary skill in the art, for example a channel, an air duct, or a pipe. In one embodiment, the makeup air pathway 24 may include a shielding member 16 designed to shield at least a portion of the article to be coated, such that at least the shielded portion of the article remains substantially uncoated.

The coating apparatus 10 may also include at least one coating member 22 positioned within the coating chamber 18. The at least one coating member 22 may be secured within the coating chamber 18 through any suitable securing means known to one of ordinary skill in the art. The coating member 22 can be positioned such that the coating member 22 can be adjusted within the coating chamber 18 to selectively coat articles of varying shapes and sizes. Additionally, the coating member 22 may be connected such that the angle between the article to be coated and the coating member can be adjusted. In one embodiment of the present invention, a plurality of coating members 22 may be employed to coat various sides of the article at one time. There may be any distance between the plurality of coating members 22 of the claimed invention, for example, between 5-30 inches, for example, 15 inches, 23 inches, or 27 inches. The structure and the operation of such coating member 22 will be well understood by one of ordinary skill in the art and, hence will not be described in detail. The coating member 22 may be a chemical vapor deposition coating device or a spray pyrolysis coating device.

Additionally, the coating member 22 may be in flow communication with a source of a titania coating material 30. The coating member 22 of the coating apparatus 10 may provide for modifying the fluid flow, fluid speed and the fluid pressure of the titania coating material 30. The titania coating material 30 may be selected from a titania precursor material selected from the group consisting of tetraisopropyl titanate, titanium tetrachloride, titanyl acetylacetonate, and combinations and mixtures thereof, just to name a few.

The coating apparatus 10 may also include at least one exhaust member 12 for removing excess coating 28 and makeup air from the coating chamber 18. The exhaust member 12 may be of any conventional material such as metal, plastic or a combination thereof, and may be of any desired dimension. The exhaust member 12 is directly or indirectly connected to the coating chamber 18 through at least one exhaust pathway 26. The at least one exhaust member 12 may further comprise at least one blower member and may be any suitable blower capable of producing airflow or gaseous transport. If there is a plurality of exhaust members 12, the exhaust members may operate at the same speed or at different speeds.

A method for coating an article in accordance with the invention will now be described. An article to be coated is placed into the coating apparatus 10 of the present invention.

Once the article is transported into the coating chamber 18 of the coating apparatus 10, a coating is applied to at least a portion of the exterior of the article by the coating members 22.

The article may be a glass material or may have a surface of glass material. For example, the article may be a glass bottle produced according to conventional practice. The temperature of the article may be any temperature, for example, below its melting temperature but well above a decomposition temperature for the coating materials that are usually applied at such location (i.e., hot end). Generally, this temperature is in the range of 1,000 to 1,600° F.

The article may be transferred by a transferring member, for example a conveyor, into the coating chamber 18 of the coating apparatus 10. The transfer into the coating chamber 18 may occur immediately after completion of formation or later. The transferring member may comprise a perforate movable belt member and may transfer or carry the article from the forming machine to the coating apparatus 10 and optionally to an annealing lehr after coating.

Once the article to be coated is inside the coating chamber 18, a coating is deposited onto the article. The coating material is introduced into the chamber 18 from a coating member 22 in flow communication with a source for a titania coating material 30. The titania coating material 30 may be deposited via chemical vapor deposition (CVD) or spray pyrolysis. The titania coating material 30 may be selected from a titania precursor material selected from the group consisting of tetraisopropyl titanate, titanium tetrachloride, titanyl acetylacetonate, and combinations and mixtures thereof, just to name a few.

The CVD process usually occurs after the forming step, but before the annealing step, while the glassware is at an elevated temperature. Depositing a coating material via CVD involves directing a vapor-laden gaseous stream onto the article to be coated. The vapor-laden gaseous stream comprises a titania-containing material and a carrier gas and is formed by heating the titania-containing material.

The titania coating materials 30 utilized to form the titania oxide coatings via CVD are generally liquid at room temperature, and may be selected from tetraisopropyl titanate, titanium tetrachloride, titanyl acetylacetonate, and combinations and mixtures thereof.

Once the vapor-laden gas is formed, it may be forced through a heated duct and a coating member 22 into the coating chamber 18.

The vapor-laden gas stream may be directed across the surfaces of the article via a coating member 22 so as to deposit the titanium oxide coating on the surface of the article. The coating thickness may be controlled by the concentration of the titania-containing material in the vapor-laden gaseous stream, the velocity of the vapor-laden gaseous stream, the length and/or geometric configuration of the coating member 22 and/or coating chamber 18, and/or the rate of the article as it travels through the coating apparatus 10.

Alternatively, the coating may be deposited by spraying a liquid metal-containing precursor (i.e., spray pyrolysis).

During spray pyrolysis a liquid titanium-containing material is atomized into a fine spray and directed toward the article to deposit a thin layer of titanium oxide of the desired color and reflective properties. Precursor compounds utilized in the pyrolytic spray coating process are generally solid at room temperature and are converted into liquid form prior to being utilized by this method. The titania coating materials 30 utilized to form the titania oxide coatings with spray pyrolysis may be selected from tetraisopropyl titanate, titanium tetrachloride, titanyl acetylacetonate, and combinations and mixtures thereof.

Once the titanium containing material compounds have been converted into a suitable liquid form, the liquid material is directed through tubing by pressurization or pumping means toward atomizing apparatus which may be situated within the coating chamber 18 of the coating apparatus 10. Within the coating chamber 18, the fine spray stream may be directed across the surface(s) of the article via a coating member 22 such that the titanium oxide coating may be deposited. During spray pyrolysis, the coating thickness may be controlled by the titania-containing material concentration in the atomized spray, the spray velocities within the enclosure, the number of atomizing devices, the specific geometric configuration of the atomizing devices within the coating apparatus 10 and by the rate of glassware traveling through the coating apparatus 10.

The method of coating the article also includes transferring air from the makeup air conduit 14 through the makeup air pathway 24 into the coating chamber 18 of the coating apparatus 10. The makeup air may be outside air or recirculated air and may be transferred by a blower member. The makeup air pushed into the coating apparatus 10 helps to dilute any excess coating remaining in the coating chamber 18 after the coating step.

To remove any excess coating in the coating chamber 18, the makeup air and the excess coating are moved out of the coating chamber 18 through an exhaust member 12 via an exhaust pathway 26. When the air is pushed out of the coating apparatus 10 after coating, the excess coating is diluted by the makeup air. The exhaust pathway 26 may be operative via a blower member. The exhaust member 12 may be connected to the makeup air pathway 24 such that the amount of air pushed into the coating chamber 18 of the coating apparatus 10 is equal to the amount of air pushed out of the coating chamber 18 of the coating apparatus 10 through the exhaust member 12.

Once the article is coated, it may be transferred or carried via the transferring member, for example a conveyer member, to at least an additional coating station or alternatively to another processing station, for example an annealing lehr or station. The annealing process is not described in detail, but would be understood by one of ordinary skill in the art.

The method of the present invention may also be combined with known methods of coating articles. Additionally, the method may be applied to coat articles entering the coating chamber 18 of the coating apparatus 10 in single file, or for simultaneously coating of multiple articles aligned substantially transversely to the direction of movement of the transferring member.

Another embodiment of the present invention is directed toward an article coated by the coating apparatus 10 and method of the present invention.

The article is not limiting to the invention and can be of any desired material having any desired characteristics, such as opaque, translucent, or transparent to visible light. By "transparent" is meant having a transmittance through the substrate of greater than 0% up to 100%. By "visible light" or "visible region" is meant electromagnetic energy in the range of 395 nanometers (nm) to 800 nm. Alternatively, the substrate can be translucent or opaque. By "translucent" is meant allowing electromagnetic energy (e.g., visible light) to pass through the substrate, but diffusing this energy such that objects on the side of the substrate opposite to the viewer are not clearly visible. By "opaque" is meant having a visible light transmittance of 0%. Examples of suitable substrates include glass substrates. For example, the substrate can be conventional untinted soda-lime-silica glass, i.e., "clear glass", or can be tinted or otherwise colored glass, borosilicate glass, leaded glass, tempered, untempered, annealed, or heat-strengthened glass. The glass may be of any type and may be of any composition.

The coating can be deposited over all or at least a portion of the substrate. The metal oxide, i.e., titania, can be crystalline or at least partially crystalline.

The coating 24 can be of any desired thickness. For example, the coating can have a thickness of 200 Å to 800 Å, for example from 300 Å to 600 Å or from 400 Å to 500 Å.

The coating 24 can be deposited directly on, i.e., in surface contact with the article. Alternatively, one or more other layers or coatings can be interposed between the coating article. For example, the coating can be an outer or the outermost layer of a multilayer coating stack.

In addition to the coating, one or more functional coatings can be deposited on or over at least a portion of the article. For example, a functional coating can be between the coating and the article or alternatively on the article. As used herein, the term "functional coating" refers to a coating that modifies one or more physical properties of the article on which it is deposited, e.g., optical, thermal, chemical or mechanical properties, and is not intended to be removed from the substrate during subsequent processing. The functional coating 28 can have one or more functional coating films of the same or different composition or functionality.

The coating of the present invention may increase the luminous reflectance of the container to 12%-38%, for example 15% to 30% or 20% to 25%.

In one embodiment of the present invention, the article is a glass beverage container having an interior chamber and an outer surface, with the coating deposited over at least a portion of the outer surface.

EXAMPLES

The method and apparatus of the invention were employed to coat conventional bottle samples 1-16 via spray pyrolysis. The parameters and the results of samples 1-16 are given in Table 1 below. The coating members employed by the coating apparatus were Binks 95 spray guns with 63SS fluid nozzles. The titania coating material of samples 1 and 3-14 was an aqueous titanyl acetylacetonate suspension and the titania coating material of samples 2 and 15-16 was an aqueous acetylacetonate suspension. The furnace temperature of the furnace at the forming station was 1180° F. for all of samples 1-16.

TABLE 1

| Sample No. | Line Speed | Exit Temp (° F.) | % Titania Coating Material Solids | Specifc Gravity of the Titania Coating Material | Mixer Speed | Recip Speed (cpm) | Distance between the coating member and the article | Exhaust Upstream | Exhaust Upstream |
|---|---|---|---|---|---|---|---|---|---|
| 1 | 75 |  | 17 | 1.08 | 420 | 28 | 8.75 | 7 | 19.5 |
| 2 | 75 |  | 19 | 1.03 | 420 | 28 | 8.75 | 7.3 | 19.3 |
| 3 | 75 |  | 17 | 1.08 | 420 | 28 | 8.75 | 8 | 18.9 |
| 4 | 55 |  | 17 | 1.08 | 420 | 28 | 8.75 | 7 | 19.5 |
| 5 | 200 |  | 17 | 1.08 | 420 | 27 | 8.75 | 7.3 | 19.3 |
| 6 | 75 | 1065 | 17 | 1.08 | 420 | 27 | ~11.5 | 8 | 19.2 |
| 7 | 150 | 1044 | 17 | 1.08 | 420 | 27 | ~11.5 | 6.9 | 18.5 |

TABLE 1-continued

| 8 | 110 | 1110 | 17 | 1.08 | 420 | 27 | ~11.5 | 7 | 18.9 |
|---|---|---|---|---|---|---|---|---|---|
| 9 | 115 |  | 17 | 1.08 | 420 | 27 | ~13.5 | 7 | 19.5 |
| 10 | 105 | 1080 | 17 | 1.08 | 420 | 27 | ~13.5 | 7.3 | 19.3 |
| 11 | 115 | 1094 | 17 | 1.08 | 420 | 27 | ~13.5 | 6.7 | 18 |
| 12 | 110 |  | 17 | 1.08 | 420 | 27 | ~13.5 | 7 | 19.5 |
| 13 | 110 | 1076 | 17 | 1.08 | 420 | 27 | ~13.5 | 7.3 | 19.3 |
| 14 | 110 | 1067 | 17 | 1.08 | 420 | 27 | ~13.5 | 6.7 | 18 |
| 15 | 150 |  | 19 | 1.03 | 420 | 27 | ~13.5 | 6 | 16 |
| 16 | 150 |  | 19 | 1.03 | 420 | 27 | ~13.5 | 6.8 | 15.9 |

| Sample No. | Exhaust Downstream | Exhaust Downstream | Fluid Flow (cc/min) | Fluid Pressure | Air Pressure | Reflected Color Y | Reflected Color x | Reflected Color y |
|---|---|---|---|---|---|---|---|---|
| 1 | 18.8 | 8.5 | 145 | 15 | 65 |  |  |  |
| 2 | 18.7 | 7.9 | 115 | 11 | 65 |  |  |  |
| 3 | 17 | 8.5 | 255 | 18 | 50 |  |  |  |
| 4 | 18.8 | 8.5 | 225 | 30 | 50 |  |  |  |
| 5 | 18.7 | 7.9 | 225 | 20 | 50 |  |  |  |
| 6 | 17.9 | 7.6 | 255 |  | 50 |  |  |  |
| 7 | 17.2 | 7.9 | 255 | 12 | 50 |  |  |  |
| 8 | 16.8 | 7.4 | 255 | 12 | 50 |  |  |  |
| 9 | 18.8 | 8.5 | 255 | 12 | 50 | 23.1 | 0.291 | 0.299 |
| 10 | 18.7 | 7.9 | 255 | 12 | 50 | 23 | 0.302 | 0.312 |
| 11 | 17.6 | 7.6 | 255 | 12 | 50 | 21.6 | 0.297 | 0.305 |
| 12 | 18.8 | 8.5 | 255 | 12 | 50 | 21.2 | 0.298 | 0.307 |
| 13 | 18.7 | 7.9 | 255 | 12 | 50 | 209.9 | 0.301 | 0.311 |
| 14 | 17.6 | 7.6 | 255 | 12 | 50 | 21.5 | 0.292 | 0.299 |
| 15 | 17.2 | 5.7 | 200 | 8 | 50 | 33.3 | 0.317 | 0.333 |
| 16 | 16.9 | 5.8 | 200 | 8 | 50 | 34.8 | 0.31 | 0.325 |

Samples 17-51, as seen in Table 2, show the effects that varying the thickness of the $TiO_2$ coating of the invention has on luminous reflectance of the articles (i.e., glass bottles). The coatings of samples 17-51 were applied via spray pyrolysis as described above.

TABLE 2

| Sample No. | Film Thickness (nm) | Luminous Reflectance |
|---|---|---|
| 17 | 30 | 25.55 |
| 18 | 44 | 27.64 |
| 19 | 37 | 24.14 |
| 20 | 25 | 18.51 |
| 21 | 40 | 26.06 |
| 22 | 9 | 11.02 |
| 23 | 11 | 10.95 |
| 24 | 6 | 9.79 |
| 25 | 10 | 10.28 |
| 26 | 7 | 8.50 |
| 27 | 23 | 17.97 |
| 28 | 21 | 16.09 |
| 29 | 17 | 13.95 |
| 30 | 18 | 12.13 |
| 31 | 14 | 13.78 |
| 32 | 53 | 36.85 |
| 33 | 60 | 29.30 |
| 34 | 47 | 32.11 |
| 35 | 55 | 27.40 |
| 36 | 61 | 29.17 |
| 37 | 36 | 24.66 |
| 38 | 34 | 22.58 |
| 39 | 28 | 21.67 |
| 40 | 33 | 23.41 |
| 41 | 42 | 20.59 |
| 42 | 47 | 29.57 |
| 43 | 49 | 30.34 |
| 44 | 41 | 28.11 |
| 45 | 40 | 27.73 |
| 46 | 52 | 30.75 |
| 47 | 38 | 21.62 |
| 48 | 34 | 22.89 |

TABLE 2-continued

| Sample No. | Film Thickness (nm) | Luminous Reflectance |
|---|---|---|
| 49 | 35 | 26.02 |
| 50 | 29 | 21.10 |
| 51 | 27 | 23.08 |

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method for coating an article having an interior and an exterior comprising:
    placing an article to be coated into a coating chamber of a coating apparatus, wherein the article is a container having an interior and an exterior;
    depositing a titania coating material onto a portion of the exterior of the article within the coating chamber to form a titania coating on a portion of the exterior of the article, wherein the titania coating has a thickness in the range of 200 Å to 800 Å and provides a luminous reflectance in the range of 12% to 38%;
    shielding a portion of the exterior of the container such that the portion shielded is not coated, wherein the shielding is accomplished by a structural shielding member configured to surround a portion of the article such that the portion of the article not to be coated extends into the structural shielding member;
    transferring air into the coating apparatus via an air pathway, wherein the air pathway directs the air through the structural shielding member and around the structural shielding member; and
    removing excess coating material from the coating apparatus via at least one exhaust member.

2. The method of claim 1, wherein the deposition step is selected from the group consisting of chemical vapor deposition and spray pyrolysis.

3. The method of claim 1, wherein the titania coating material is selected from the group consisting of tetraisopropyl titanate, titanium tetrachloride, titanyl acetylacetonate, and combinations and mixtures thereof.

* * * * *